US007125768B2

(12) United States Patent
Reinberg

(10) Patent No.: US 7,125,768 B2
(45) Date of Patent: Oct. 24, 2006

(54) METHOD FOR REDUCING SINGLE BIT DATA LOSS IN A MEMORY CIRCUIT

(75) Inventor: Alan R. Reinberg, Westport, CT (US)

(73) Assignee: Micron Technology, Inc., Boise, ID (US)

( * ) Notice: Subject to any disclaimer, the term of this patent is extended or adjusted under 35 U.S.C. 154(b) by 401 days.

(21) Appl. No.: 09/382,442

(22) Filed: Aug. 25, 1999

(65) Prior Publication Data

US 2001/0044186 A1   Nov. 22, 2001

(51) Int. Cl.
*H01L 21/8247* (2006.01)
(52) U.S. Cl. .................................................. 438/257
(58) Field of Classification Search ......... 438/257–267
See application file for complete search history.

(56) References Cited

U.S. PATENT DOCUMENTS

| 4,840,917 | A | * | 6/1989 | Sheu ........................ 438/396 |
| 5,045,488 | A |   | 9/1991 | Yeh ............................. 437/43 |
| 5,098,866 | A |   | 3/1992 | Clark et al. ................. 437/239 |
| 5,132,237 | A |   | 7/1992 | Matthews .................... 437/40 |
| 5,145,797 | A | * | 9/1992 | Nakanishi ................... 438/265 |
| 5,229,311 | A |   | 7/1993 | Lai et al. ....................... 437/43 |
| 5,397,724 | A | * | 3/1995 | Nakajima et al. ........... 438/257 |
| 5,504,020 | A | * | 4/1996 | Aomori et al. |
| 5,706,552 | A |   | 1/1998 | Hsieh ............................. 16/82 |
| 5,818,710 | A |   | 10/1998 | LeVan Suu ................. 364/141 |
| 5,972,765 | A | * | 10/1999 | Clark et al. .................. 438/308 |
| 6,159,829 | A | * | 12/2000 | Warren et al. ............... 438/257 |
| 6,218,245 | B1 | * | 4/2001 | Xiang et al. ................. 438/258 |

FOREIGN PATENT DOCUMENTS

WO          94/19829     * 9/1994

OTHER PUBLICATIONS

Kizilyalli et al., "Deuterium Post-Metal Annealing of MOSFET's for Improved Hot Carrier Reliability", IEEE Electron Device Letters, vol. 18, No. 3, Mar. 1997, pp. 81-83.*
"TN-28-01 Boot Block Flash Memory", *Micron Quantum Devices, Inc.*, pp. 5-9-5-11, (1997).
Fong, Y., et al., "Oxides Grown on Textured Single-Crystal Silicon—Dependence on Process and Application in EEPROMs", *IEEE Transactions on Electron Devices*, 37(3), pp. 583-590, (Mar. 1990).
Hess, K., et al., "Giant Isotope Effect in Hot Electron Degradation of Metal Oxide Silicon Devices", *IEEE Transactions on Electron Devices*, 45(2), pp. 406-416, (Feb. 1998).
Hsu, F.C., et al., "Effect of Final Annealing on Hot-Electron-Induced MOSFET Degradation", *IEEE Electron Device LEtters*, EDL-6(7), pp. 369-371, (Jul. 1985).
Rees, Jr., W.S., *CVD of Nonmetals*, ISBN 3-527-29295-0, Table of Contents, (1996).

* cited by examiner

*Primary Examiner*—Richard A. Booth
(74) *Attorney, Agent, or Firm*—Schwegman, Lundberg, Woessner & Kluth, P.A.

(57) ABSTRACT

The present invention includes a method for reducing random bit data loss in a memory circuit. The method comprises a semiconductor layer that has a surface. The semiconductor layer is exposed at an elevated temperature to an atmosphere comprising deuterium thereby forming a film on the semiconductor layer comprising deuterium. A memory circuit is fabricated on or within the semiconductor layer.

13 Claims, 3 Drawing Sheets

METHOD FOR REDUCING SINGLE BIT DATA LOSS IN A MEMORY CIRCUIT

FIELD OF THE INVENTION

The present invention relates to fabricating electrically programmable and electrically erasable memory cells and particularly, fabricating the cells to substantially eliminate hot-electron degradation effects.

BACKGROUND

Memory circuit arrays positioned on semiconductor chips have become an important component common to VLSI circuits. Memory circuits rely upon storage of data in a memory array within a section of a chip designated for memory. The memory array is comprised of memory cells.

Memory circuits are of two basic types—volatile memory circuits and nonvolatile memory circuits. A nonvolatile memory circuit does not lose stored "bits" or information when the circuit loses power. For a volatile memory circuit, information is lost when the circuit loses power.

ROM or read-only memory is a basic type of nonvolatile memory. Data stored in ROM is a permanent part of the circuit. The ROM circuit provides precoded information to a user. One variation of ROM is an erasable programmable ROM, commonly referred to as EPROM. To create the erasable feature, a transistor, such as a memory MOS transistor, is selectively charged to impart data to the memory field. The memory field is programmed by a procedure of hot electron injection. The memory field may be re-programmed by draining off the charge, removing the chip from the circuit and imparting a new memory with an exterior source.

An improvement to EPROM is a memory circuit that can be reprogrammed while the chip is in a socket of a machine. This memory circuit, an EEPROM circuit, is prepared for reprogramming by draining charge and by charging the memory circuit in place. The EEPROM memory circuit is programmed and reprogrammed by hot electron injection.

Both EPROM and EEPROM comprise a large number of memory cells having electrically isolated gates, referred to as floating gates. Data is stored in the memory cells in the form of charge on the floating gates. Charge is transported to or removed from the floating gates by program and erase operations, respectively.

One other type of memory circuit, a FLASH circuit, is a form of EEPROM, which is a form of electronically erasable, programmable, read only memory. FLASH memory is based upon a one-transistor cell design but has a capacity for in-socket programming and erasure. FLASH memory is a type of nonvolatile memory. FLASH memory differs from EPROM and EEPROM in that erase programs are done in blocks.

One prior art memory circuit, illustrated in FIGS. 1(a) and 1(b), comprises a memory 184 with a memory array 198, control logic 194 and address logic 196, illustrated in prior art FIG. 1(b). The address logic 196 receives an address from an external system, such as a microprocessor. The control logic 194 receives external commands to store or to retrieve data to or from the memory array 198 at cell location(s) provided to the address logic 196 by the external system. Subsequently, the data associated with cell location(s) is respectively transmitted to or received from the external system.

The memory 184 may be FLASH memory. The memory array 198 includes a plurality of FLASH cells of each having a floating gate transistor such as storage transistor 182 of FIG. 1(a). The storage transistor 182 comprises two gates, a floating gate stack 170 and a control gate stack 172, an active source region 152a and an active drain region 152b and a channel 162 also formed in the semiconductor 168. Both the floating gate stack 170 and the control gate stack 172 are formed by conductors 122 and 124 and gate oxides 144 and 146.

Nonvolatile memory storage in a circuit requires a permanent storage of charge in the floating gate stack region of the memory circuit. Nonvolatile memory storage in a memory circuit such as an EEPROM or a FLASH memory circuit is made possible by materials used in the gate region, including materials added by doping and by structural design of the gate region. These materials include silicon of a wafer supporting the circuit and silicon oxide formed during gate fabrication.

FLASH memory is especially sensitive to degradation effects due to a substantial number of hot electrons generated in each memory cell during flash memory cycling. Specifically, during an operation of programming a memory cell, a positive programming voltage is applied to the control gate stack 172. This positive programming voltage attracts electrons from the semiconductor 168 which is a p-type substrate and causes them to accumulate at the surface of channel region 162. A voltage on drain 152b is increased and the source 152a is connected to ground. As the drain-to-source voltage increases, electrons flow from the source 152a to drain 152b via the channel region 162. As electrons travel toward drain 152b they acquire substantially large kinetic energy and are referred to as hot electrons. The hot electrons are injected through the oxide layer 146 and are stored on floating gate stack 170.

FLASH memory cycling occurs when the FLASH memory is repeatedly programmed and erased. With FLASH memory cycling, a significant number of substrate hot electrons are trapped within an insulating gate oxide layer 146, such as is shown in the prior art FLASH circuit in FIG. 1(a), that separates a drain region 152a from the floating gate stack 170. The greater the number of cycles that a FLASH memory device is subjected to, the greater the number of carriers that become trapped in the gate oxide.

The trapping and accumulation of hot electrons starts a charging process. Gradually, as the charge on the floating gate increases, the electric field in oxide layer 144 decreases and eventually loses its capability of attracting any more of the hot electrons to the floating gate 170. At this point, the floating gate stack 170 is fully charged. The negative charge from the hot electrons collected in the floating gate stack 170 raises the cell's threshold voltage above a logic 1 voltage. If the voltage on control gate stack 172 is brought to a logic 1 during a read operation, the cell will barely turn on. Sense amplifiers are used in the memory to detect and amplify the state of the memory cell during a read operation. Thus, data is read from a memory cell based upon its "ON" characteristics.

Hot electron degradation effects have been observed in FLASH memories in two ways. Most noticeably, the erase/programming times for a given memory array are increased far beyond their normal limits. This phenomena is frequently referred to a "erasetime/programtime push-out." This means that as the devices are repeatedly cycled, a greater amount of erase/program time must be allotted for each successive cycle in order to insure that the entire array is completely charged or discharged.

A second indication that degradation effects are manifested in a FLASH memory cell array is an excess charge loss which renders the memory devices unreliable. That is, even though the device is initially programmed to an "apparently" correct level, with time that programming level may drop below the limits of reliable operation. This "apparent" charge loss of the devices occurs after extensive program-erase cycles.

Several methods have been developed in attempts to reduce hot electron induced degradation. One method uses a lightly doped drain, LDD, positioned proximal to a highly doped region. The LDD spreads an electric field in an attempt to prevent the hot electrons from gaining sufficient energy to break the silicon-hydrogen bonds. The use of an LDD reduces but does not eliminate the effects of hot electron induced degradation. Furthermore, the use of an LDD may further degrade the transistor by creating higher resistance than desired.

Another method is described in an article by F. C. Hsu et al., "Effect of Final Annealing on Hot-Electron-Induced MOSFET Degradation," IEEE Device Letters, vol. ed1–6, No. 7, July 1985. A metal oxide semiconductor field effect transistor (MOSFET) as used herein refers to a field-effect transistor containing a metal gate over thermal oxide over silicon. The method described in Hsu et al. for reducing the effects of hot electron induced degradation has included a use of a nitrogen ambient rather than a hydrogen ambient to perform a final anneal in a post-metallization procedure in order to reduce the amount of hydrogen available to bond with silicon. Although the use of the nitrogen ambient reduced the amount of hydrogen available to bond with silicon, it was difficult to eliminate hydrogen entirely, since many of the procedures employed to fabricate a MOSFET are hydrogen-dependent. Thus, while the use of nitrogen ambient reduced the amount of hydrogen present, the use did not eliminate hydrogen nor the problems caused by hot electron induced degradation.

Electrons are removed from the floating gate to erase the memory cell. Many memories, including FLASH memories, use Fowler-Nordheim (FN) tunneling to erase a memory cell. The erase program is accomplished by electrically floating the drain, grounding the source, and applying a high negative voltage to the control gate. This creates an electric field across the gate oxide and forces electrons off the floating gate. The electrons then tunnel through the gate oxide.

One of the difficulties with FLASH memories has been with the erase operation using Fowler-Nordheim tunneling. The erase operation requires high voltages, and is relatively slow. Further, an erratic over erase can be induced as a result of the very high erase voltages used. These very high erase voltages are a fundamental problem arising from the high electron affinity of bulk silicon or large grain polysilicon particles used as the floating gate. The high erase voltages create a very high tunneling barrier. Even with high negative voltages applied to the gate, a large tunneling distance is experienced with a very low tunneling probability for electrons attempting to leave the floating gate. This results in long erase times because the net flux of electrons leaving the gate is low. Thus, the tunneling current discharging the gate is low.

Other phenomena result as a consequence of this very high negative voltage. One phenomenon is hole injection. Hole injection into the oxide is experienced which can result in erratic over erase, damage to the gate oxide itself and the introduction of trapping states.

A reference of K. Hess et al., *IEEE Transactions on Electron Devices*, vol. 45, No. 2, February 1998, entitled, "Giant Isotope Effect in Hot Electron Degradation of Metal Oxide Silicon Devices," at pp. 406 to 416, describes a giant isotope effect of hot electron degradation. The effect was observed in integrated circuits of a complementary metal oxide silicon (CMOS) type. To study this effect, the authors passivated silicon wafers with deuterium instead of hydrogen.

The authors observed that the desorption efficiency for deuterium from silicon was about a factor of fifty lower than for hydrogen for energies above about 5 eV. The authors concluded that hydrogen migration played some role in mechanisms responsible for gate oxide wear-out. In particular, the authors concluded that a large deuterium content at a silicon wafer interface could be correlated to an improvement in transistor lifetime for some types of transistors. The authors attributed the longer lifetime to minimized damage occurring during a single event of hot electron injection.

With hot electron injection, the steady state of hydrogen within a silicon dioxide film is disrupted because the energy from the injection ionizes the hydrogen to H+ions. It is believed that electrons from the hot electron injection excite or collide with hydrogen that is bound to silicon or polysilicon at the Si/SiO$_2$ interface. A collection of H+ ions drift to a memory storage area of the memory circuit, such as a floating gate, and combine with stored electrons.

The stored electrons are ordered within fields so as to "hold" nonvolatile memory within the circuit. Once hydronium ions are combined with electrons, hydrogen gas is formed and data within the memory is destroyed. As a consequence, the transistor is degraded.

SUMMARY OF THE INVENTION

One embodiment of the present invention comprises a method for reducing single bit data loss in a memory circuit. The method includes providing a semiconductor layer that has a surface. The semiconductor layer is exposed, at an elevated temperature, to an atmosphere comprising a vapor comprising a hydrogen isotope such as deuterium, thereby imparting deuterium on or within the semiconductor layer. A memory circuit is fabricated on or within the semiconductor layer.

In one embodiment, the high temperature treatment in a deuterium atmosphere forms a film of a thin layer of silicon dioxide. In another embodiment, the film formed is silicon nitride. In one other embodiment, the film is silicon oxynitride. For each embodiment, the film is prepared in an atmosphere that comprises deuterium. In another embodiment, the high temperature treatment with deuterium anneals the silicon surface.

Another embodiment of the present invention comprises a memory circuit that comprises a main body comprised of silicon. A memory cell is disposed on and within the main body. A gate region is proximal to the memory cell. A film is disposed on or within the gate region or under the gate region. The film comprises deuterium. The memory circuit is resistant to random single bit data loss.

Another embodiment of the present invention comprises a method of forming a non-volatile electrically alterable semiconductor memory cell. The method includes providing a silicon substrate and fabricating a field oxide region and a channel region over and within the silicon substrate. The method also includes growing an oxide over the channel region in an atmosphere enriched in deuterium, fabricating one or more gate members proximal to the oxide and passivating the memory cell in an atmosphere that comprises deuterium.

One other embodiment of the present invention comprises a thermal oxide component or a tunneling oxide component of a non-volatile, electrically alterable semiconductor memory cell that comprises deuterium.

Another embodiment of the present invention comprises a method for passivating a non-volatile, electrically alterable semiconductor memory cell. The method comprises providing a non-volatile, electrically alterable semiconductor memory cell and exposing the memory cell to an atmosphere that comprises deuterium.

Another embodiment of the present invention comprises a method for overlaying source and drain regions of a non-volatile, electrically alterable semiconductor memory cell with a thermal oxide layer. The method comprises providing a silicon substrate and defining source and drain regions. The method also comprises growing the thermal oxide layer over the source and drain regions in an atmosphere that comprises deuterium.

DETAILED DESCRIPTION

Figure 1A:
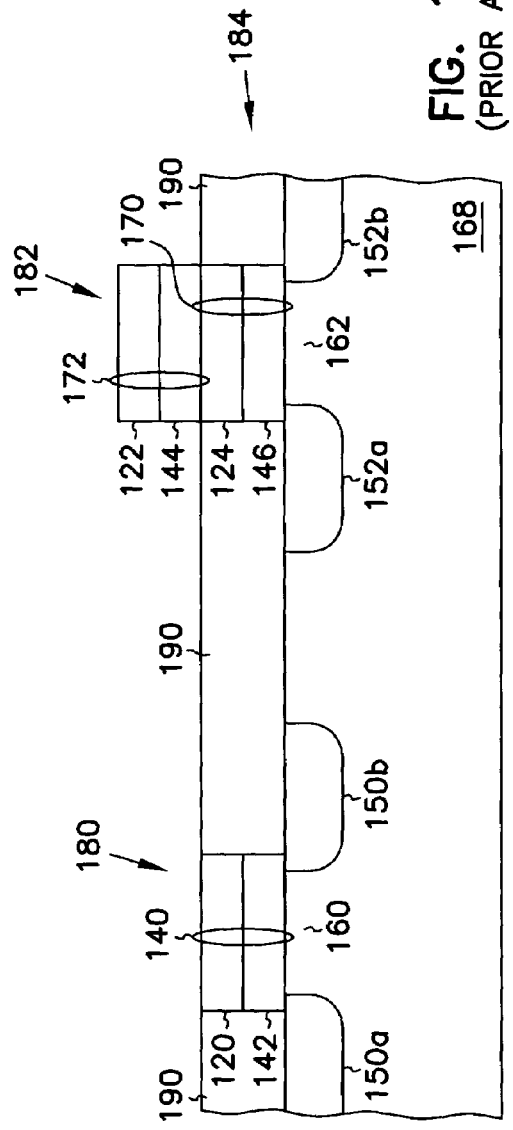
FIG. 1(a) is a cross-sectional view of one prior art embodiment of a FLASH device.
Figure 1B:
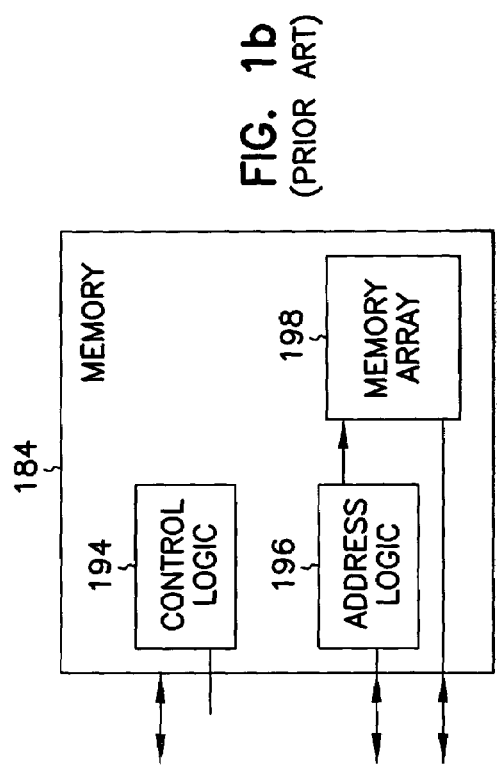
FIG. 1(b) is a prior art block diagram of a memory.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

For purposes of this specification, the terms "chip", "wafer" and "substrate" include any structure having an exposed surface of semiconductor material with which to form integrated circuit (IC) structures. These terms are also used to refer to semiconductor structures during processing, and may include other layers that have been fabricated thereupon. The terms include doped and undoped semiconductors, epitaxial semiconductor layers supported by a base semiconductor or insulator, as well as other semiconductor structures well known in the art. The term "conductor" is understood to include semiconductors, and the term "insulator" is defined to include any material that is less electrically conductive than the materials referred to as "conductors." The following detailed description is, therefore, not to be taken in a limiting sense. The term "hydrogen isotope" refers to deuterium, tritium and compounds that include deuterium and tritium.

Figure 2:
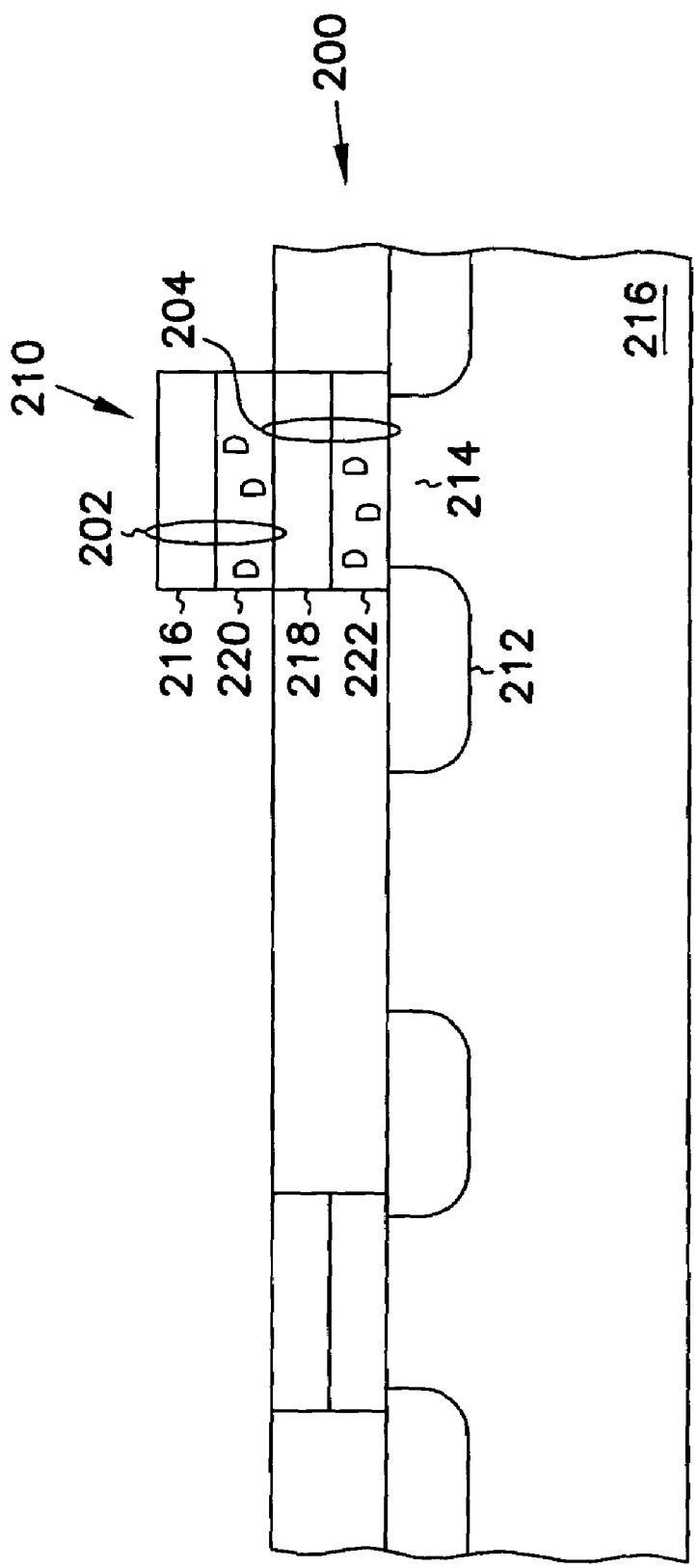
FIG. 2 is a cross-sectional view of one embodiment of a FLASH device of the present invention.

A FLASH memory circuit according to one embodiment of the present invention, illustrated generally at 200 in FIG. 2 and a memory cell of the present invention, illustrated generally at 210 in FIG. 2 are fabricated employing metal-oxide-semiconductor, MOS, technology as well as non-metal based technology utilizing materials such as polysilicon. One embodiment of a method for fabricating the FLASH memory circuit 200 utilizes MOS fabrication techniques in conjunction with a process for fabricating a FLASH memory device, i.e. EPROM, or an array which relies on hot electron injection of carriers between a substrate and a floating gate member of the memory cell.

One embodiment of the method of the present invention, for reducing low temperature single bit data loss in memory such as FLASH memory, comprises providing a silicon wafer with a silicon surface; fabricating a gate region in the wafer; and treating a portion of the silicon surface to form a thin layer of insulator film adjacent to the gate region and under the gate region. The thin layer of insulator film is prepared using an annealing medium that comprises deuterium.

The FLASH memory circuit 200 comprises the FLASH cell 210 that comprises a floating gate 204 and a control gate 202 as well as an active region 212 and a channel 214 formed in a silicon semiconductor 216. Both the floating gate 204 and control gate 202 are formed by conductors 216 and 218 and gate oxide 220 and 222. The gate oxide 220 and 222 is comprised of silicon oxide or silicon nitride or silicon oxynitride or combinations of these oxides. A hydrogen isotope such as deuterium, designated "D" in FIG. 2, is entrapped within the film. The FLASH memory circuit of the present invention is resistant to single bit data loss within its memory at low temperature.

Repeated cycling of a FLASH memory results in charge loss from the floating gate 204 and a corresponding degradation in device performance. It is believed that this phenomena is caused in part by the introduction of hydrogen into the active regions of the field effect device. The presence of hydrogen enhances interface state generation and causes device degradation. It is also believed, that a single bit data loss type of degradation is reduced by annealing silicon regions proximal to the memory circuit in a medium enriched in deuterium, and forming the gate oxide 220 and 222 which is enriched in deuterium. The annealing is performed, in one embodiment, as a final post-metallization anneal. The anneal is performed in an atmosphere comprising approximately four percent to one-hundred percent deuterium with the remaining gas being an inert gas or nonreactive gas such as nitrogen or a combination of the inert gas and the nonreactive gas.

Intermediate anneals performed during memory circuit fabrication may also be performed in a deuterium atmosphere or other Hydrogen isotope atmosphere. These intermediate anneals include oxidation of specific memory cell layers in an atmosphere that comprises either deuterium or a compound that includes deuterium such as $D_2O$, $D_2$, or $ND_3$.

Figure 3:
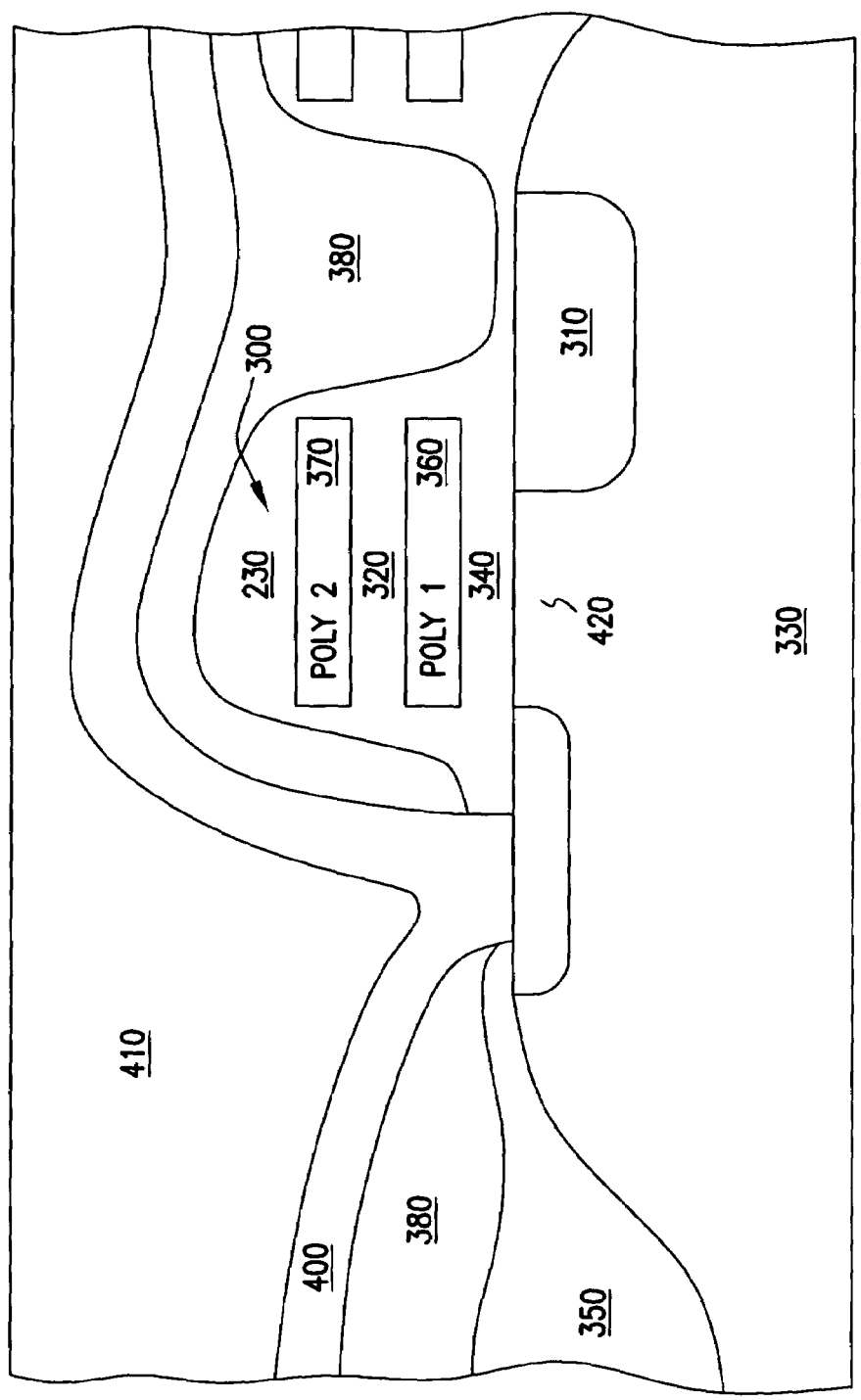
FIG. 3 is a cross-sectional view of one other embodiment of a FLASH device of the present invention.

One other embodiment of the memory cell device of the present invention is illustrated at 300 in FIG. 3. The FLASH memory cell 300 is also fabricated utilizing metal-oxide-semiconductor, MOS, techniques. The FLASH memory cell 300 is fabricated on a p-type silicon substrate 330. Field oxide isolation regions 350 are defined using a silicon nitride masking layer. The field oxide regions 350 are then grown, in one embodiment, to a thickness of about 7500 Angstroms.

Following formation of the field oxide regions 350, a high-grade tunneling oxide 340 is thermally grown above a channel region 420 of the substrate. After that, in one embodiment, a phosphorous-doped polycrystalline silicon, polysilicon, layer 360 is deposited and etched in a pattern which will subsequently form the floating gates for each of the memory cells. After a thermally grown dielectric layer 320 is grown over layer 360, a second layer of polysilicon 370 is deposited and etched in a pattern which runs generally perpendicular to the pattern of layer 360. The second layer 370 defines the control gate for the memory device. Layer 360 forms the floating gate of the device. Control gate member 370 stretches over the active channel region 420 of the cell and extends beyond the tunnelling region to the next cell, thereby forming a word line in an array.

The source and drain regions for the cells are formed after the polysilicon, poly 2 layer 370 has been defined. In one embodiment, an arsenic implant is used to form a source drain region. The source drain region may receive an additional phosphorous implant, thereby forming a deeper phosphorous source junction because the phosphorous diffuses into the silicon. The phosphorous implant causes the source side to have a deeper and more gradual dopant concentration gradient than the drain side. The deeper implantation reduces substrate current during electrical erase. The source drain region may also be formed by ordinary diffusion steps. Region 310 represents a common source within the FLASH memory array.

After the source and drain regions are formed, a thermal oxide layer 230 is grown over the source/drain and polysilicon gate surfaces. A CVD dielectric film 380 is then deposited on top of the thermal oxide to planarize the device.

To open the drain contact, the device is masked and etched until an area of silicon directly over the drain region is exposed. This becomes the drain contact region 340. In one embodiment, an aluminum metalization layer 400 is deposited over the device to connect the drain regions and forms the bit lines of the memory array.

The entire device is then passivated by annealing an insulating layer 410 in an atmosphere that comprises deuterium and a nitrogen ambient so that the layer 410 is comprised of oxynitride and deuterium. The insulating layer 410 may also be comprised of silicon oxide and deuterium. It is believed that forming a passivation layer that comprises deuterium retards diffusion of hydrogen atoms under the metalization layer and migration to the channel region 420. The hydrogen atoms cannot then interact with continuous charge transfer that occurs in the gate oxide region of the memory devices.

Passivation as used herein refers to a process whereby a film is grown on a surface to either chemically protect it from the environment or to provide electronic stabilization of the surface. The method of the present invention includes embodiments wherein intermediate passivation in an atmosphere comprising deuterium is performed on layers such as 220 and 222 in FIG. 2. The method of the present invention also includes embodiments wherein a device passivation in an atmosphere comprising deuterium or other Hydrogen isotope is performed on a layer such as 410 in FIG. 3.

One conventional silicon passivation reaction, free from deuterium is the following:

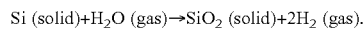

Si (solid)+$H_2O$ (gas)→$SiO_2$ (solid)+$2H_2$ (gas).

With the conventional silicon passivation reaction of an intermediate layer, hydrogen remaining in the oxide proximal to a gate is believed to be in a steady state relationship with the oxide. Substituting deuterium ions or other Hydrogen isotopes for protons in the process of surface silicon oxide formation in and proximal to memory storage areas such as gate regions is believed to produce a reduction in the drift of positively charged particles. In one other passivation embodiment, passivation of a silicon/silicon dioxide interface of a wafer comprises a treatment of a dangling bond with $H_2$ in order to make a passivated dangling bond and hydrogen gas.

The passivation reaction using deuterium or other Hydrogen isotope in order to form silicon dioxide, is as follows:

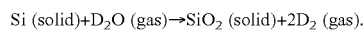

Si (solid)+$D_2O$ (gas)→$SiO_2$ (solid)+$2D_2$ (gas).

Passivation utilizing one embodiment of the method of the present invention is performed in a deuterium or other Hydrogen isotope atmosphere at a temperature of 400° C. to 450° C. for 0.5 to 2 hours. The percentage of deuterium in the passivating gas is at least about 10 percent by volume and may be about 100 percent. Other non-reactive components of the passivation gas include helium or nitrogen gas. The passivation occurs as a consequence of annealing the silicon/silicon dioxide surface of the semiconductor wafer. In addition to this thermal oxidation-based method, deuterium may be introduced into a silicon dioxide layer by pyrolytic diffusion from the gas or from a plasma or RF sputter deposition.

Hydrogen is replaced by deuterium in a silicon nitride film by exposing a silicon substrate to ammonia in an atmosphere enriched in deuterium at a temperature range of 950° C. to 1200° C. In one embodiment, the ammonia is present as a component in a gaseous mixture of deuterium with 30 percent by volume ammonia.

Silicon oxynitride films, SiOxNy, are formed by nitridation of silicon oxide films. These films may be made with $D_2$, $D_2O$ and $ND_3$ in order to replace hydrogen in the films with deuterium. This film array is made by utilizing the reactants $D_2$, $D_2O$ and $ND_3$ in sequential reactions. The sequential reactions are for the preparation of silicon dioxide and silicon nitride layers of the film sandwich. Deuterium may also be introduced in or proximal to the gate region by targeted deuterium treatment, such as ion implantation, in a particular oxide and by annealing the entire device in a deuterium atmosphere.

It is to be appreciated that the method and memory circuit of the present invention have been described in particular detail with respect to preferred processes and structures. The present invention, however, is not intended to be limited to these preferred embodiments. One skilled in the art will readily recognize that the actual method and circuit may be adjusted to accommodate particular conditions.

What is claimed is:

1. A method for reducing random single bit data loss in a FLASH memory circuit having a programming operation and an erase operation, comprising:
   providing a semiconductor layer having a surface;
   heating the layer in an atmosphere comprising a Hydrogen isotope wherein the Hydrogen isotope is incorporated into the layer; and
   fabricating a memory circuit having a programming operation and an erase operation, comprising single bit data using the semiconductor layer, the fabricating comprising fabricating a gate region in the layer; treating a portion of the surface to form a thin layer of insulator film adjacent to the gate region and under the gate region; and heating the thin layer in an atmosphere comprising Hydrogen isotope, wherein single bit data loss is reduced and wherein random single bit data loss is prevented in both the programming operation and the erase operation.

2. The method of claim 1 and further comprising forming a film on the semiconductor layer that comprises the Hydrogen isotope.

3. The method of claim 1 and further comprising exposing the semiconductor layer to a temperature that oxidizes the semiconductor layer.

4. The method of claim 1 and further comprising exposing the semiconductor layer to a temperature that anneals the semiconductor layer.

5. The method of claim 1 and further comprising exposing the semiconductor layer, sequentially, to atmospheres comprising Hydrogen isotope and ammonia enriched in Hydrogen isotope at an elevated temperature.

6. The method of claim 1 and further comprising fabricating a second gate region within the memory circuit.

7. The method of claim 6 and further comprising forming a film comprising Hydrogen isotope adjacent to the gate region of the memory circuit in order to reduce single bit data loss.

8. The method of claim 6 and further comprising forming a film comprising Hydrogen isotope within the gate region of the memory circuit in order to reduce single bit data loss.

9. The method of claim 1 and further comprising passivating the semiconductor layer in an atmosphere comprising Hydrogen isotope.

10. The method of claim 1 and further comprising forming a field oxide in the semiconductor layer.

11. The method of claim 10 and further comprising annealing the field oxide layer in an atmosphere that comprises Hydrogen isotope or a Hydrogen isotope containing compound.

12. The method of claim 10 and further comprising annealing at a temperature that is at least about 800 degrees Centigrade.

13. The method of claim 10 and further comprising oxidizing the annealed field oxide layer in an atmosphere that comprises Hydrogen isotope.

* * * * *

UNITED STATES PATENT AND TRADEMARK OFFICE
CERTIFICATE OF CORRECTION

PATENT NO. : 7,125,768 B2  Page 1 of 1
APPLICATION NO. : 09/382442
DATED : October 24, 2006
INVENTOR(S) : Reinberg It is certified that error appears in the above-identified patent and that said Letters Patent is hereby corrected as shown below:

On the Title page, in item (56), under "Other Publications", in column 2, line 14, delete "LEtters," and insert -- Letters, --, therefor.

Signed and Sealed this

Twenty-seventh Day of February, 2007

JON W. DUDAS
*Director of the United States Patent and Trademark Office*